(12) United States Patent
Tsumura et al.

(10) Patent No.: US 7,843,525 B2
(45) Date of Patent: Nov. 30, 2010

(54) LIQUID CRYSTAL DISPLAY APPLIANCE

(75) Inventors: Makoto Tsumura, Hitachi (JP); Shigeo Ohashi, Tsuchiura (JP); Nobuyuki Kaku, Oiso (JP)

(73) Assignee: Hitachi, Ltd., Tokyo (JP)

( * ) Notice: Subject to any disclaimer, the term of this patent is extended or adjusted under 35 U.S.C. 154(b) by 171 days.

(21) Appl. No.: 12/329,153

(22) Filed: Dec. 5, 2008

(65) Prior Publication Data
US 2009/0147175 A1    Jun. 11, 2009

(30) Foreign Application Priority Data
Dec. 7, 2007    (JP) .............................. 2007-317028

(51) Int. Cl.
*G02F 1/1333*    (2006.01)
*G02F 1/1335*    (2006.01)

(52) U.S. Cl. .......................................... 349/58; 349/94

(58) Field of Classification Search ............. 349/58–60, 349/65, 94; 362/633
See application file for complete search history.

(56) References Cited

U.S. PATENT DOCUMENTS

| | | | |
|---|---|---|---|
| 6,636,282 B2 * | 10/2003 | Ogawa et al. | 349/58 |
| 6,885,411 B2 * | 4/2005 | Ogawa et al. | 349/58 |
| 2004/0085491 A1 * | 5/2004 | Ogawa et al. | 349/58 |
| 2005/0259444 A1 * | 11/2005 | Choi | 362/633 |
| 2006/0290266 A1 * | 12/2006 | Cho et al. | 313/496 |

FOREIGN PATENT DOCUMENTS

JP    2006-189850    7/2006

* cited by examiner

*Primary Examiner*—Akm E Ullah
(74) *Attorney, Agent, or Firm*—Antonelli, Terry, Stout & Kraus, LLP.

(57) ABSTRACT

A liquid crystal display apparatus which exhausts heat generated within the apparatus efficiently, and reduces temperature increase in the heat-frail sections is provided.

A circuit board mounting surface at the back of the liquid crystal monitor unit is divided into a plurality of board mount areas using the vertically extending reinforcement members. A signal circuit board section and TCON (Timing control) circuit board section are disposed in the same board mount area which is different from the partition where the power supply circuit board section resides. By arranging this way, the temperature increase in the heat-frail sections of the signal circuit board section is reduced, and the hot air heated by the power supply circuit board in the power supply circuit board section goes up along the reinforcement members, thus an efficient heat exhaustion is achieved.

11 Claims, 7 Drawing Sheets

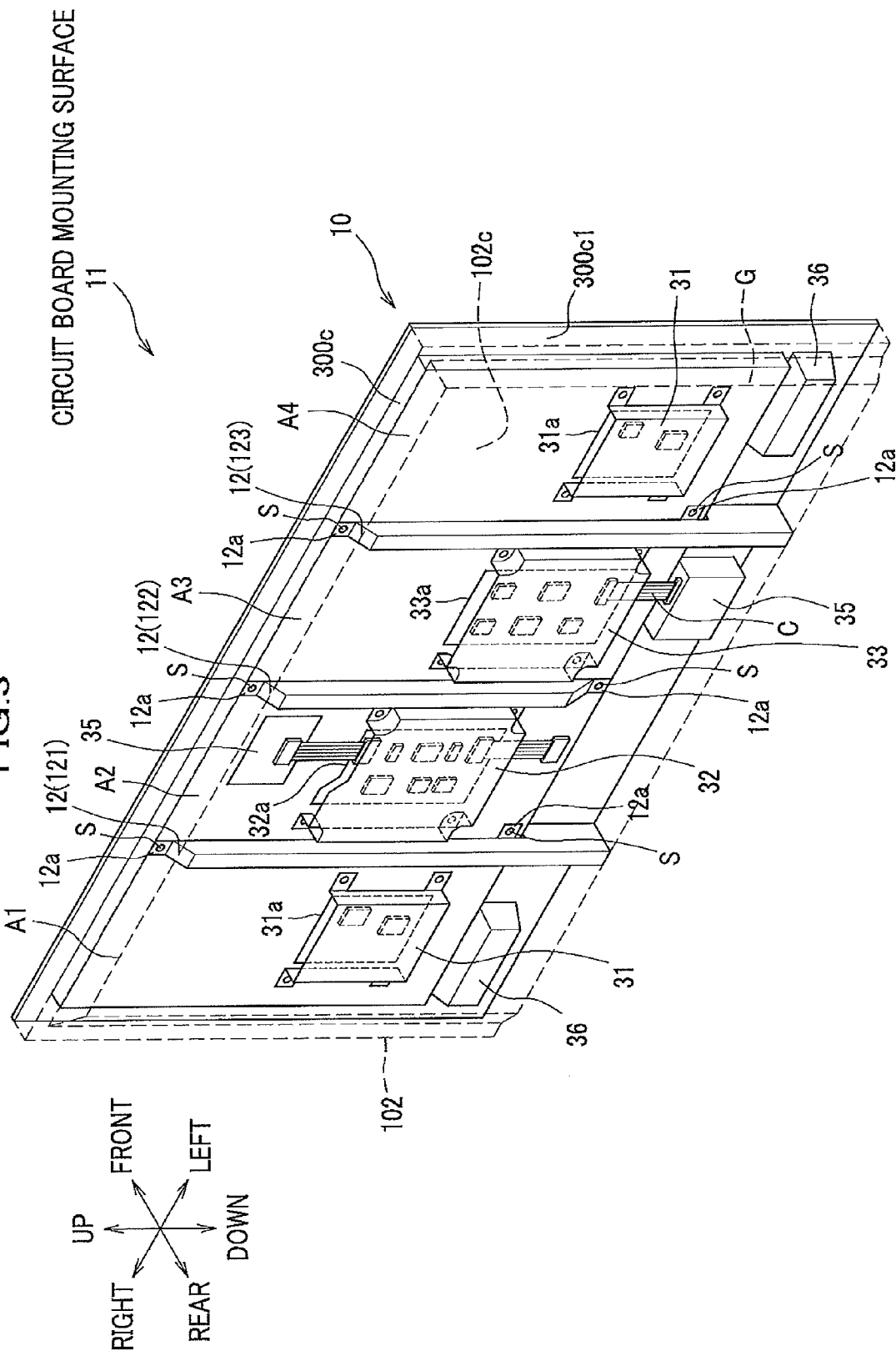

LIQUID CRYSTAL DISPLAY APPLIANCE

CROSS REFERENCE TO RELATED ART

The present application claims the benefit under 35 U.S.C. 119 of Japanese Patent Application No. 2007-317028 filed on Dec. 7, 2007 the disclosure of which is incorporated into this application by reference.

BACKGROUND OF THE INVENTION

1. Field of the Invention

The present invention relates to a liquid crystal display appliance for efficient dissipation of the heat generated within the apparatus.

2. Description of the Related Art

More and more flat panel display appliances such as plasma display panels of an emissive type and liquid crystal display appliances of a non-emissive type have been recently used in place of conventional Cathode Ray Tube appliances (CRT).

The liquid crystal display appliance utilizes a liquid panel display panel working as an optical modulator of a light transmissive type and a lighting system (referred to as backlight unit) which is attached on the back side of the liquid and emits light to the liquid crystal display panel. A picture image on the liquid crystal display panel is formed as a result of controlling transmittance of light from the backlight unit.

The liquid crystal panel display appliance has an advantage of the thickness of its outer shape being reduced to much smaller than CRT and the further thinner liquid crystal display appliance is desired and requested from. On the other hand, it becomes difficult to keep an airflow passage inside a housing constituting an outer shape of the liquid crystal display appliance through which air heated by heat generated inside is to be discharged. As a result, the heat air inside is not efficiently discharged from inside the housing while the liquid crystal display appliance is made thinner, which results in a problem with heat-susceptible components being over heated. In order to solve this problem, Japanese Laid-Open Patent Publication No. 2006-189650 discloses a technology in which the air flow rate inside the housing is increased by producing a forced convection air flow inside the housing with a cross flow fan for exhausting the inner air attached on the rear surface of the upper portion of the housing and heat air inside the housing is more efficiently discharged.

However, the technology disclosed in Japanese Laid-Open Patent Publication No. 2006-189650 requires spaces for the cross flow fan to rotate around the axis installed in the horizontal direction of the liquid crystal display appliance and for accommodation of the rotation mechanism to spin the cross fan rotor, which is in the way of making the liquid crystal display appliance further thinner.

In order to solve the problem above mentioned and make the liquid crystal display appliance thinner, it is possible to have a blower module installed near a bottom of the liquid crystal display appliance to produce air intake from the back side of the liquid crystal display appliance and exhaust the suctioned air from the upper portion. This structure utilizes both a forced convection caused by the blower module and a natural ambient convection inside the housing to discharge heat generated within the appliance. However, by disposing the blower module at the bottom of the liquid crystal display appliance, the forced convection airflow caused by the blower module disturbs the airflow through the natural convection. Thus exhaustion of the heat generated within the appliance becomes ineffective, which creates a problem of temperature rise in the heat-susceptible components.

The object of the present invention is to provide a liquid crystal display appliance which inhibits temperature rise in heat-susceptible components by efficiently exhausting heat generated within the housing.

To solve the abovementioned problem, the present invention provides a construction where the heat generating circuit board is arranged into an area substantially divided and separated with reinforcement members which extend in the display vertical direction in order to prevent the heat generated by the heat generating circuit board from being transferred to adjacent areas.

Making use of the present invention, such a liquid crystal display apparatus is provided as is capable of preventing temperature rise in the heat-susceptible components by effectively dissipating the heat generated within the apparatus is.

BRIEF DESCRIPTION OF THE DRAWINGS

FIG. 3 is a perspective view showing the circuit board mounted surface.

BEST MODE FOR CARRYING OUT THE INVENTION

The best mode embodiment form of the present invention will be described in detail with reference to the accompanying drawings.

Figure 1A:
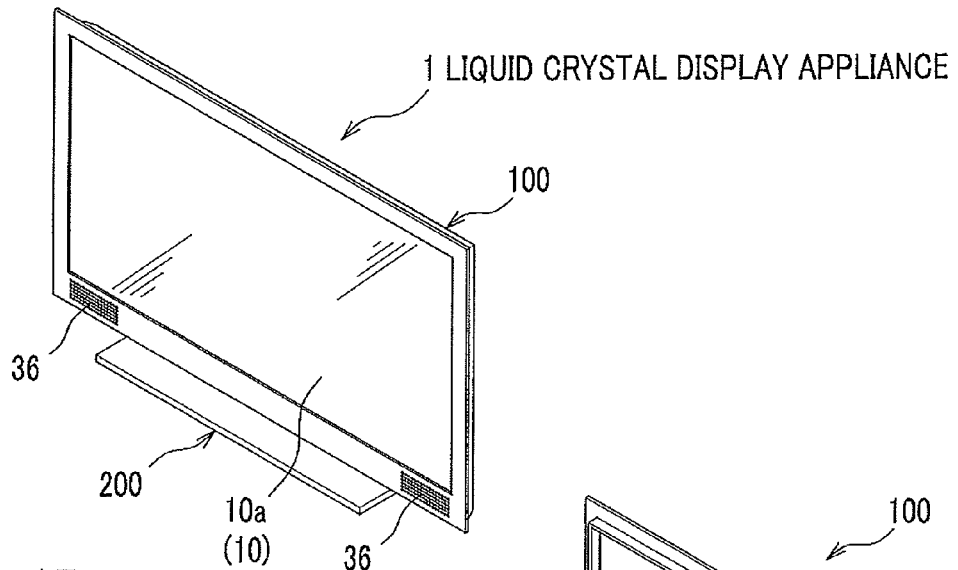
FIG. 1A is a perspective view showing the liquid crystal display appliance of the present invention.
Figure 1B:
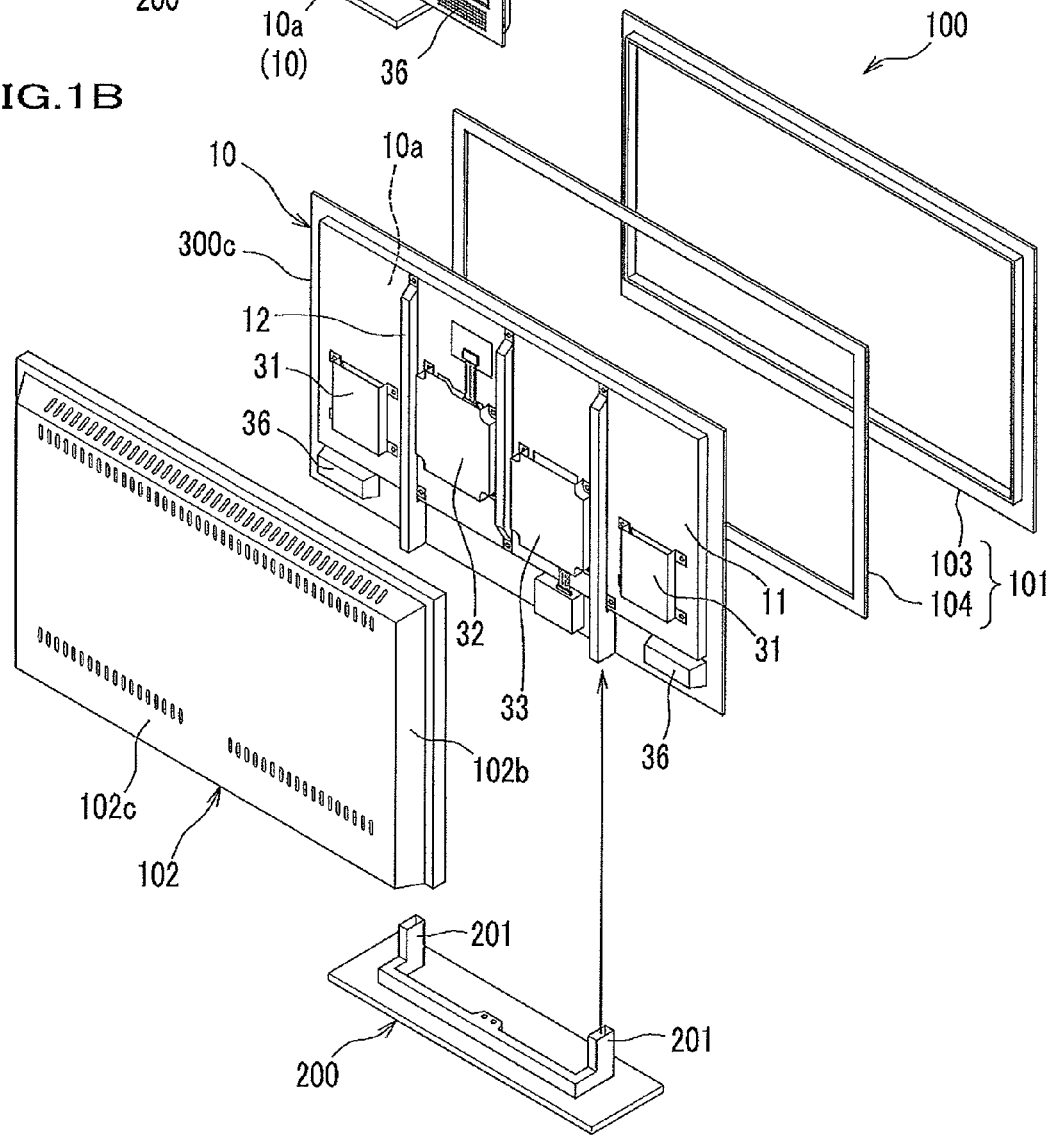
FIG. 1B is an exploded perspective view of the liquid crystal display appliance of the present invention.

FIG. 1A is a perspective view showing the liquid crystal display appliance of the present invention. FIG. 1B is an exploded perspective view of the liquid crystal display appliance of the present invention. As shown in FIG. 1A, the liquid crystal display appliance 1 (referred to hereinafter as LCD appliance 1) is a thin type liquid crystal display appliance constituted by a liquid crystal display monitor unit 10 (referred to hereinafter as LCD monitor unit 10) such as a 32 inch size type, for example, a housing 100 to house the LCD monitor unit 10, and a stand 200 which supports the housing 100 from the beneath. The stand 200 is detachable from the housing 100. The LCD appliance 1 can be placed on a floor or on a television set stand (not shown) with the stand 200 is attached. When the stand 200 is detached, the LCD appliance 1 can be hung on a wall with a mounting bracket. Furthermore, speakers 36 are installed in the front lower portion of the housing 100.

As is shown in FIG. 1B, the housing 100 comprises a front case 101 which is the front part of the housing 100, a back case 102 which is the rear part of the housing 100, and a LCD monitor unit 10 is housed between the back case 102 and the front case 101.

The front case 101 comprises a front bezel 103 of a rectangular shape surrounding the display screen 10a of the LCD monitor unit 10 (please refer to FIG. 1A), and the rectangular shaped bezel base 104 which connects the front bezel 103 and the back case 102. Both the front bezel 103 and the bezel base 104 are made of a plastic material, for example. The bezel base 104 includes an attachment with which to fix the back case 102 on the rear surface of bezel base 104 with screws.

The back case 102, being made of plastic material, for example, is a box-shape member formed of a back case flat portion 102c and a back case sidewall 102b surrounding the back case flat portion 102c and is fixed to house the liquid crystal display monitor unit 10. A circuit board mount surface 11 is formed on the rear side surface of LCD monitor unit 10, where circuit boards to drive the LCD monitor unit 10 are mounted. By attaching a plurality of the reinforcement members 12 which are made of metal material, for example, to the circuit board mount surface 11, the LCD monitor unit 10 becomes a major structurally reinforcing element. Further, by attaching the front bezel 103, the bezel base 104 and the back case 102 to the LCD monitor unit 10 which is reinforced with the reinforcement members 12, the strength of the entire housing 100 is maintained.

Between the back case flat portion 102c of the back cover 102 and the circuit board mount surface 11, a space is created, where the circuit boards to drive the LCD monitor unit 10 are mounted.

Additionally, the stand 200, having a pair of attachment members 201 protruding upward, is capable of supporting the housing 100 from beneath with the attachment members 201 fit into the reinforcement members 12. Besides, in case the LCD appliance 1 is hung on the wall, the back case 102 is secured to attachment brackets (not shown), then affixed to the wall through the attachment brackets.

Figure 2:
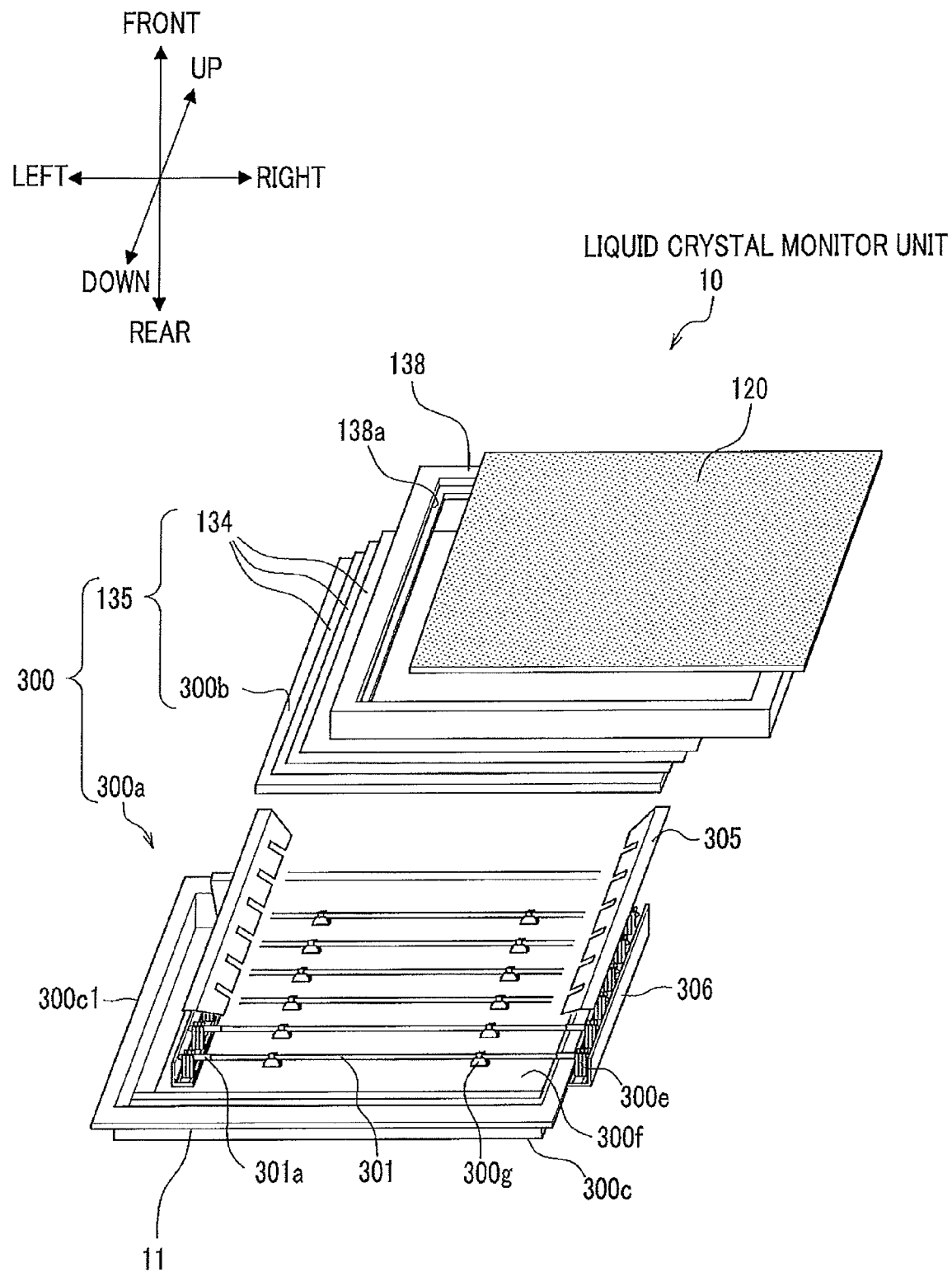
FIG. 2 is an exploded view of the liquid crystal monitor unit according to the embodiment of the present invention.

FIG. 2 is an exploded view of the liquid crystal monitor unit according to the embodiment of the present invention. In the present embodiment, as shown in FIG. 2, orientations of the liquid crystal display monitor unit 10 are designated as follows. The liquid crystal display panel 120 is on the front side while the backlight unit 300 is on the rear side which is opposite to the front side. The shorter side of a rectangle for the LCD panel 120 is in parallel with the display vertical direction (up☐down direction) while the longer side of the rectangle for the LCD panel 120 is the display horizontal direction (right☐left direction).

Alternatively, for a LCD panel 120 which has the vertical length being longer than the horizontal length, the direction of the longer side of the LCD panel 120 (referred to hereinafter as LCD panel 120) can be designated as the display vertical direction while the shorter side of the LCD panel 120 can be designated as the display horizontal direction.

As shown in FIG. 2, the LCD monitor unit 10 typically includes the LCD panel 120, backlight unit 300, and the intermediate frame 138.

And, on the back side of a surface of the back frame 300c, on which the backlight unit 300 is mounted, the circuit board mounting surface is formed.

The intermediate frame 138 which is made of a plastic material and disposed on the back side of the LCD panel 120 has a function of fixing the LCD panel 120. The intermediate frame 138 is a rectangular shape member having an opening in the center to allow the backlight unit 300 to emit light onto the LCD panel 120 and has a groove 138a surrounding the opening.

The LCD panel 120, after fit into the groove 138a of the intermediate frame 138, is affixed to the intermediate frame 138 with an adhesive or the like. The front case 101 (refer to FIG. 1B) is affixed to the intermediate frame 138 into which the LCD panel 120 is fit.

The backlight unit 300 comprises a light source unit 300a, a diffuser plate 300b, and optical sheets 134.

The light source unit 300a comprises a box-shaped back frame 300c having a back frame flange 300c1 around the opening, a plurality of elongated fluorescent lamps 301 of EEFL (External Electrode Fluorescent Lamp) or the like being arranged in parallel to the longitudinal direction of the back frame 300c, and a diffusion plate 301 being disposed to cover the opening of the back frame 300c. The fluorescent lamp 301 is not limited to EEFL, it may be CCFL (Cold Electrode Fluorescent Lamp) or HCFL (Hot Cathode Fluorescent Lamp), and the like as well. In addition, although there are six of elongated fluorescent lamps indicated in FIG. 2, the number of is not limited to six. For example, for the LCD panel 120 of a 32 inch size, sixteen to twenty of elongated fluorescent lamps 301 of type EEFL or CCFL are required while three to ten elongated fluorescent lamps 301 of type HCFL suffice.

Additionally, though not illustrated, a plurality of LED (Light Emitting Diode) may be utilized for the light source.

The lamp holders 300g are fixed inside the back frame 300c. The reflective sheet 300f is fixed on the back frame 300c by pinching a portion of the reflective sheet 300f between the lamp holders 300g and the back frame 300c. The elongated fluorescent lamps 301 are fixed a predetermined height above the reflective sheet 300f by the lamp holder 300g. A couple of lower side moldings 306 are secured to the back frame 300c. The lower side moldings 306 have the lamp electrode holders 300e fixed to hold the electrodes 301a formed on both ends of the elongated fluorescent lamps 301. A diffuser plate 300b is attached to an upper side molding 305 which are disposed to cover a lower side molding 306.

A diffuser plate 300b and one or more optical sheets 134 constitute an optical element 135.

The optical sheets 134 are disposed on the back side of the intermediate frame 138, having a function of further improving in-plane homogeneity of light emitted to the LCD panel 120 from the backlight unit 300 or a function of enhancing brightness of the LCD panel 120 in the front☐ rear direction by having the light from the backlight unit 300 more oriented in the front☐ rear direction. The number of the optical sheets may not be limited, whereas FIG. 2 illustrates three of such optical sheets.

The diffuser plate 300b is transparent, includes small particles and bubbles dispersed on which incident light is reflected and diffused and transmits light emitted from the elongated fluorescent lamps 301 while diffusing the light while diffusing it.

The backlight unit 300, by reflecting light emitted from the elongated fluorescent lamps 301, forms a plane light source emitting light from the front of the optical sheet 134 by repeating diffused reflections through the optical element 135 and the reflective sheet 300f.

FIG. 3 shows a perspective view showing the circuit board mounted surface. As shown in FIG. 3, the circuit board mount surface 11 is formed on the back side surface of the back frame 300c of the LCD monitor unit 10. Namely, it is on the back side of the LCD monitor unit 10. If the LCD monitor unit 10 is housed in the back case 102, a space G is formed between the back case flat portion 102c of the back case 102 and the circuit board mount surface 11.

In the present embodiment, three of reinforcement members 12 are attached on the back side surface of the back frame 300c of the LCD monitor unit 10 and disposed substantially in parallel with one another so that each reinforcement member 12 extends in the display vertical direction.

The reinforcement member 12 is, for example, a bar-like member made of a metal and has a substantially horse-shoe cross section and screw fixing portions 12a formed in the upper portion and in the lower portion, through which the reinforcement member is fixed on the back frame 300c with an opening of the horse-shoe shape on the back side surface of the back frame 300c. The circuit board mount surface 11 is divided into four areas with the three reinforcement members 12, an board mount area A1, an board mount area A2, an board area A3 and an area A4 in the order from the right end of the circuit board mount surface 11.

The three reinforcement members 12 are denoted by the right reinforcement member 121, the center reinforcement member 122 and the left reinforcement member 123 in the order from the right side of the circuit board mount surface 11. The center reinforcement member 122 is fixed at a substantially center the LCD monitor unit 10 in the display horizontal direction and the length of the center reinforcement member 122 is substantially equal to that of the box shape portion of the back frame 300c in the display vertical direction.

Each of the lengths of the right reinforcement member 121 and the left reinforcement member 123 is substantially equal to a length from the upper end of the box shape portion of the back frame 300c to the lower end of the back frame flange 300c1. There are steps formed on both portions on both sides of the opening of the horse-shoe shape in each of the right reinforcement member 121 and the left reinforcement member 123 which is formed to be in agreement with the step between the box shape portion of the back frame 300c and the back frame flange 300c1.

There is an opening (not shown) formed with each horse-shoe shape cross section member of the right reinforcement member 121 and the left reinforcement member 123 and the back frame flange 300c1 which is opened downward. The attachment member 201 of the stand 200 is inserted and fit into this opening.

All the reinforcement members 12 are made abutted on the inner surface of the back case flat portion 102c of the back case 102 after the LCD monitor unit 10 is fixed in the back case 102 in the present embodiment. Since all the reinforcement members 12 abut on the back case flat portion 102c, the space G, which is formed between the circuit board mount surface 11 and the back case flat portion 102c of the back case 102, is substantially divided by the reinforcement members 12, which function as separation walls.

In the present embodiment, a power supply circuit board 33a to drive the LCD monitor unit 10, and other circuit boards are mounted in the four mount areas A1 though A4 on the circuit board mount surface 11. In the space G formed between the circuit board mount surface 11 (corresponding to the back surface of the LCD monitor unit 10) and the back case flat portion 102c, the power supply circuit board 33a and other circuit boards are disposed. The other circuit boards of the present embodiment are such as an inverter circuit board 31a, a signal circuit board 32a, and a TCON (LCD Timing Controller) circuit board 34, and not limited to these types. The details of each circuit board will be described later.

The board mount area A1 is formed on the right side of the right reinforcement member 121 and an area in which an inverter circuit board section 31 inclusive of an inverter circuit board is mounted.

The board mount area A2 is formed between the right reinforcement member 121 and the center reinforcement member 122 and an area in which an signal circuit board section 32 inclusive of a signal circuit board 32a and a TCON circuit board 34 are mounted.

The board mount area A3 is formed between the center reinforcement member 122 and the left reinforcement member 123 and an area in which a power supply circuit board section 33 inclusive of a power supply circuit board 33a is mounted.

The board mount area A4 is formed on the left side of the left reinforcement member 123 and an area in which an inverter circuit board section 31 is mounted.

A power supply section is disposed on the lower portion of the back frame flange 300c1 located below the back frame 300c in the board mount area A3. A power supply voltage (of household electric power 100V, for example) is inputted to the power supply section 35 through a power supply wire cable. The inputted power supply voltage is inputted to the power supply circuit board 33a through a cable C.

Furthermore a couple of speakers 36 are attached on the lower portion of the back frame flange 300c1 of the back frame 300c. One is disposed in the board mount area A1 and the other in the board mount area A4. Since the lower portion of the back frame flange 300c1 of the back frame 300c is located a sufficiently large distance apart from the back case 102 fixed on the back side of the LCD monitor unit 10, such a thick component as a speaker 36 and a power supply section 35 is attached thereon.

Figure 4A:
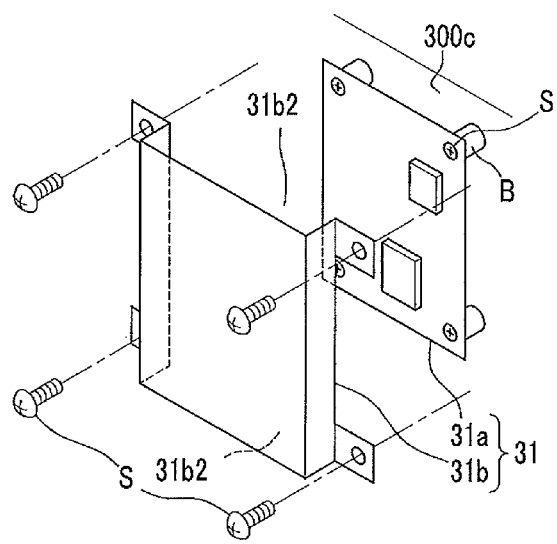
FIG. 4A is an exploded view of the mounted inverter circuit board.
Figure 4B:
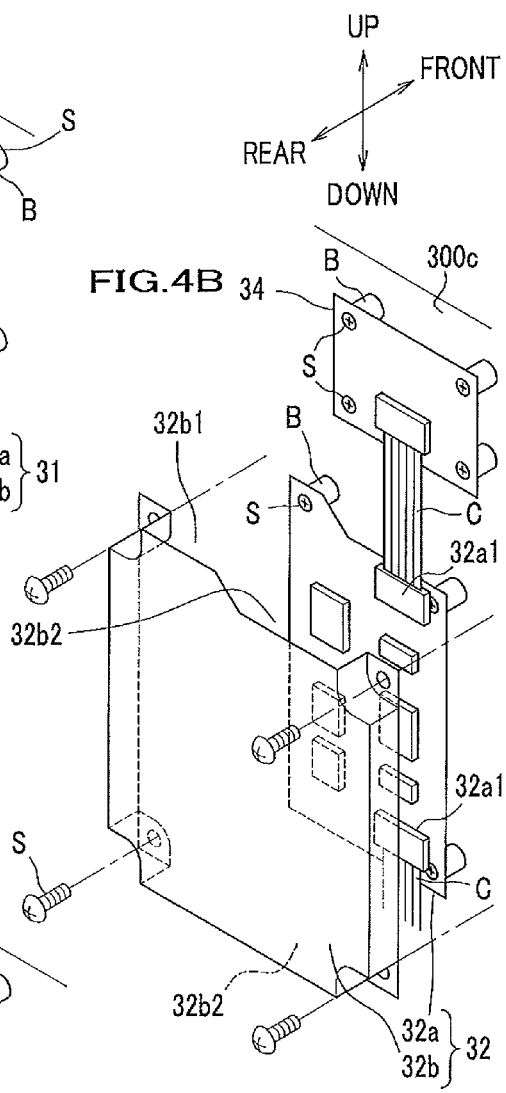
FIG. 4B is an exploded view of the mounted signal circuit board and TCON (TFT-LCD Timing Controller) circuit board.
Figure 4C:
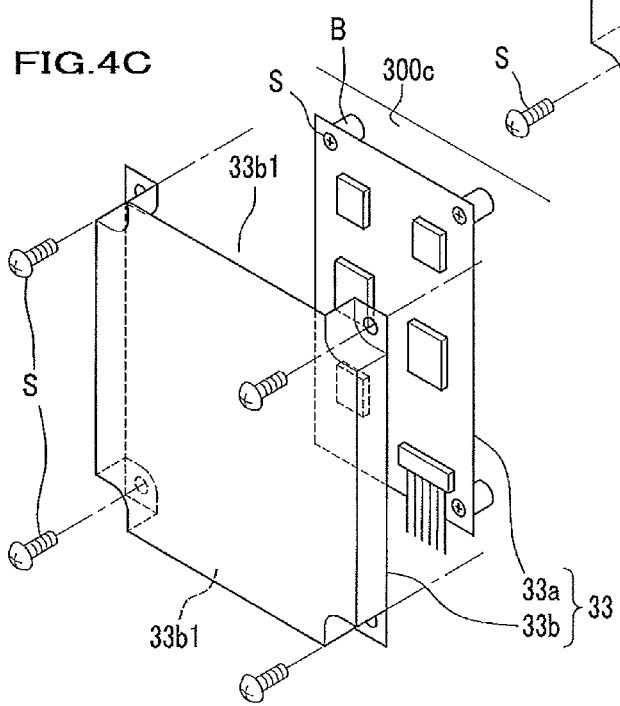
FIG. 4C is an exploded view of the mounted power supply circuit board.

FIG. 4A, 4B and 4C show circuit boards to be mounted on the circuit board mount surface 11. FIG. 4A is an exploded view of the mounted inverter circuit board. FIG. 4B is an exploded view of the mounted signal circuit board and TCON (LCD timing controller) circuit board. FIG. 4C is an exploded view of the mounted power supply circuit board.

As is shown in FIG. 4A, the inverter circuit board 31 includes the inverter circuit board 31a to generate a high voltage to drive the elongated fluorescent lamps 301 installed in a light source unit 300a (seen in FIG. 2) of the backlight unit 300 and a shield cover 31b to shield the inverter circuit board 31a to prevent electromagnetic interference (EMI) from radiating outside. The shield cover 31b is a member which has a substantially horse-shoe shaped cross section so that the inverter circuit board 31a is covered and is made preferably of a metal to prevent EMI radiation. The inverter circuit boards 31a are secured to bosses B formed in the board mount areas A1 and A4 (please refer to FIG. 3) using screws S. The shield covers 31b are fixed by screws S in the board mount areas A1 and A4 with an opening formed by the horse-shoe shape cross-section toward the back frame 300c to cover the inverter circuit board 31a.

More specifically, there are a couple of openings 31b2 of a horse-shoes shape cross-section formed on the upper and lower ends of the shield cover 31b. The openings 31b2 on the upper side and lower side of the shield cover 31b are disposed so that these openings face each other in substantially the display vertical direction.

Further, though not illustrated, a sidewall to cover a part of the horseshoe shaped cross section of the shield cover 31b may be formed to make the shield cover 31b in substantially a box shape. By adding the sidewall, the strength of the shield cover is enhanced. More specifically, the openings which face each other in the display vertical direction may take any shape, as far as a sufficient shielding against EMI radiation is secured.

As shown in FIG. 4B, the signal circuit board section 32 includes a signal circuit board 32a which generates image signals to control chromaticity and brightness external inputted to drive the liquid crystal monitor device 10 (please refer to FIG. 2), audio signals, and drive signals for the backlight unit 300 (please refer to FIG. 2), and a shield cover 32b which shields the signal circuit board 32 to prevent the redundant EMI radiation from the signal circuit board 32a.

The shield cover 32b, whose cross section is in a substantially horseshoe shape, for example, shields the signal circuit board 32a, and is made preferably of a metal in order to prevent the EMI radiation. The signal circuit board 32a is secured to bosses B formed in the board mount area A2 of the back frame 300c (as seen in FIG. 3) using screws S with an opening formed by the horseshoe-shape cross-section toward the back frame 300c to cover the signal circuit board 32a.

The signal circuit board 32a is provided with connectors 32a1 for inputting and outputting signals from and to other circuit boards. In the exemplary embodiment of the present invention, a connector 32a1 is attached on the upper end portion of the signal circuit board 32a and is connected with a cable C which runs upward and the other connector 32a1 is attached on the lower end of the signal circuit board 32a and is connected with another cable C which runs downward. Furthermore, the upper connector 32a1 is disposed above the lower connector 32a1 and these two connectors 32a1, 32a1 are lined substantially straight in the display vertical direction.

In the board mount area A2 on the back frame 300c (please refer to FIG. 3) is mounted the TCON circuit board 34 which generates driving signals for the LCD panel 120 (please refer to FIG. 2) in the LCD monitor unit 10 according to the image signals generated by the signal circuit board 32a. The TCON circuit board 34 is secured by screws S to bosses B in the board mount area A2 on the back frame 300c, and receives the image signals through the cable C which is connected to the connector 32a1 on the signal circuit board 32a.

Because the image signals inputted to the TCON circuit board 34 from the signal circuit board 32a are of high frequencies, a problem with deterioration of the input signal to the TCON circuit board may occur if the length of the cable C which connects the signal circuit board 32a to the TCON circuit board 34 becomes long. In the present embodiment, the TCON circuit board 34 is disposed above the signal circuit board 32a in the same board mount area A2 (as seen in FIG. 3) with the signal circuit board 32a, and configured to be connected through the cable C to the connector 32a1 which is disposed in the upper portion of the signal circuit board 32a.

As already described, by disposing both of the signal circuit board 32a and the TCON circuit board 34 in the same partition A2, the length of the cable C connecting the signal circuit board 32a and the TCON circuit board 34 is made so short that deterioration of signals to be inputted to the TCON circuit board is prevented.

Since the signal circuit board 31 is provided with the connector 32a1 which accepts cable C, the shield cover 32b has an opening through which to pass the cable C.

As described previously, in the present embodiment, both of the connector 32a1 which is located in the upper portion of the circuit board 31, and the connector 32a2 which is located in the lower portion of the circuit board 31, are lined roughly in the display vertical direction. The openings 32b2 of the shield cover 32b have to be formed at upper and lower ends thereof. The shield cover 32b which has the horseshoe-shaped openings vertically oriented is fixed to the back frame 300c, forming the horseshoe-shape openings 32b on both ends thereof. More particularly, the openings 32b2 in the shield cover 32 are disposed facing each other substantially in the display vertical direction.

Further, though not illustrated, a sidewall to cover a part of the horseshoe shaped cross section of each of the upper and lower portions of the shield cover 32b may be formed to make the shield cover 32b in substantially a box shape. By adding the sidewall, the shield cover 32b is to be strengthened. More specifically, the openings face each other in the display vertical direction may take any shape, as far as a good shielding against EMI radiation is secured.

The power supply circuit section 33, as seen in FIG. 4C, includes the power supply circuit board 33a which generates electric power of 24 volt DC, for example, to drive the liquid crystal display appliance 1 (as seen in FIG. 1A) inputted from an AC power supply source to the power supply section 35 (illustrated in FIG. 3), and a power supply cover (a shield cover) 33b which is made of a burn-resistant insulating material of a horseshoe-shaped cross section and shields the power supply circuit board 33a. The power supply circuit board 33a is secured to the bosses B which is formed on the back frame 300c in the board mount area A3 (as seen in FIG. 3) using screws S.

Furthermore, the power supply cover 33b is secured to the back frame 300c and has the cross-section of a horseshoe-shape with an opening formed by the horseshoe-shape on, and having the open part of the horseshoe-shape shield facing the power supply circuit board 33a shrouding the power supply circuit board 33a, which prevents an electric shock of inadvertent contact to the power supply circuit board 33a Particularly, the openings 33b1 in the power supply cover 33b are disposed facing each other substantially in the display vertical direction.

In addition, the shield cover 31b of the inverter circuit board 31a and the shield cover 32b of the signal circuit board 32a may be attached and fixed to the reinforcement member 12 (please refer to FIG. 3), for example. With this structure, the shield cover 31b and 32b are grounded through the reinforcement member 12 of a metal member and the shielding effect against the EMI radiation is improved.

The liquid crystal display device 1 is configured to comprise the LCD monitor unit 10 which has the circuit board mount surface 11 as explained (as seen in FIG. 3) and is disposed between the front case 101 and the back case 102 as seen in FIG. 1B.

When the inverter circuit board 31a, the signal circuit board 32a and the power supply circuit board 33a, which are indicated in FIG. 4A to 4C, are driven to drive the LCD monitor unit 10, these circuit boards generate heat. The power supply circuit board 33a generates more heat than the other circuit boards, which induces temperature rise of the other circuit boards and could affect the other circuit boards due to the temperature rise and, for example, induces an overrun of an integrated circuit. Especially the signal circuit board 32a includes heat susceptible electric components such as the integrated circuit. Therefore the temperature rise in the signal circuit board 32a due to the heat transmitted from other circuit boards is preferably prevented.

In order to overcome the abovementioned problem in the present embodiment, the circuit board mount surface 11 is divided into the 4 separated board mount areas with the three reinforcement members 12 which extend in the display vertical direction, the power supply circuit board 33a generating more heat is disposed in a board mount area while the signal circuit board 32a which is heat susceptible is disposed in a board mount area which is separated with the reinforcement members 12 and different from the board mount area where the power supply circuit board 33a is disposed. As a result, the heat transmission from the power supply circuit board 33a to the signal circuit board 32a is suppressed and this embodiment has an effect of suppressing the temperature rise in the signal circuit board 32a.

Moreover, since the reinforcement members 12, which divide the circuit board mount surface 11 into the four board mount areas, are fixed to extend in the display vertical direction, the air heated by the heat generated by a circuit board goes up straight within a board mount area where the circuit board is disposed. As a result the heat is efficiently exhausted.

Furthermore, each reinforcement member 12 is made abutted on the back case flat portion 102c of the back case 102 (as seen in FIG. 3) and works as a separation wall to divide the space G. Therefore, for instance, the air heated by the power supply circuit board 33a does not flow into any of the other board circuit areas (A1, A2, A4) where the power supply circuit board 33a is not disposed. Accordingly the heat generated in a board mount area affecting any circuit board disposed in any of the other board mount area is suppressed.

As is explained, the image signals generated by the signal circuit board 32a disposed in the signal circuit board section 32 are of high frequencies and tend to generate noises. In the embodiment of the present invention, the inverter circuit boards 31 are disposed not in the board mount area A2 where both the signal circuit board section 32 and the TCON circuit board 34 are disposed, but in the board mount areas A1 and A4. As a result the inverter circuit boards are less likely to be affected by the noises generated by the signal circuit board 32a.

Figure 5A:
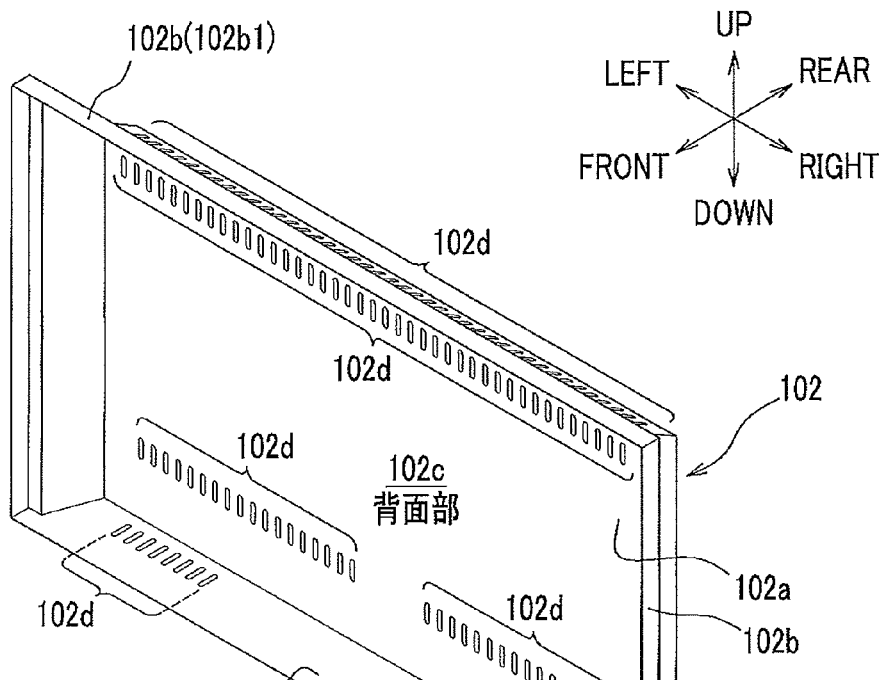
FIG. 5A is a perspective view of the back case of the housing showing ventilation holes.

Next, heat exhaustion of the liquid crystal display appliance 1 (as seen in FIG. 1A) in which the LCD monitor unit 10 having the circuit board mount surface 11 as seen in FIG. 3 is installed is to be explained. FIG. 5A is a perspective view of the back case of the housing showing ventilation holes. In the present embodiment, as shown in FIG. 5A, the back case 102 of the crystal display appliance 1 is a shallow box-shaped member having a back case sidewall 102b surrounding the back case flat portion 102c and an front-side opening 102a, in which the LCD monitor unit 10 (please refer to FIG. 3) is accommodated.

The ventilation holes 102d are formed in the back case 102 to exhaust heat generated from the LCD monitor unit 10 (as seen in FIG. 1A). In the present embodiment, the ventilation holes 102d are formed in the upper sidewall 102b1 and the lower sidewall 102b2 of the back case 102, in the upper end portion of the back case flat portion 102c near the upper sidewall 102b1, and in the lower-end portion of the back case flat portion 102c near the lower sidewall 102b2. That is, the vertical center of the rear unit 102c does not have any ventilation holes 102d.

Figure 5B:
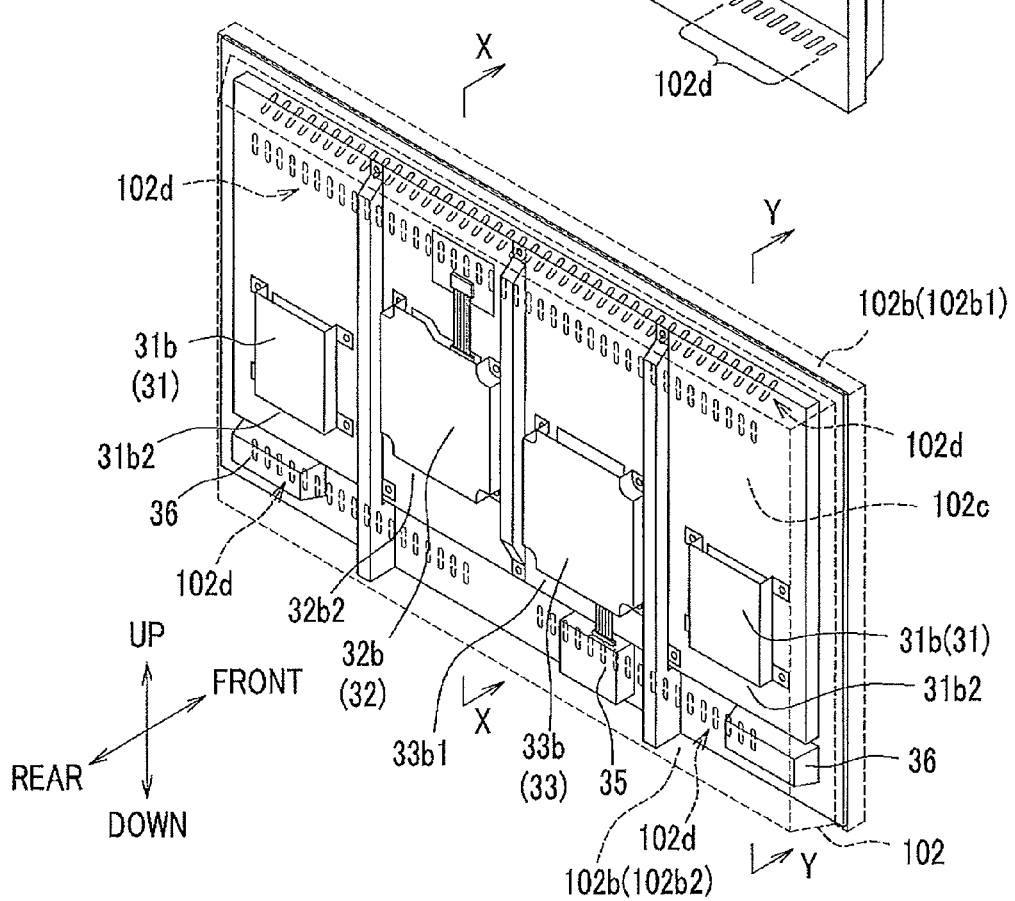
FIG. 5B is a perspective view of the liquid crystal display monitor unit housed in the back case, which is seen from the back side.

FIG. 5B is a perspective view of the liquid crystal display monitor unit housed in the back case, which is seen from the backside.

As illustrated in FIG. 5B with broken lines, the ventilation holes 102d formed in the upper end portion of the back case flat portion 102c near the upper sidewall 102b1 are disposed above the shield cover of 31b of the inverter circuit boards sections 31, the shield cover 32b of the signal circuit section 32, and the power supply cover 33b of the power supply circuit board section 33.

The ventilation holes 102d formed in the lower-end portion of the back case flat portion 102c near the lower sidewall 102b2 are disposed above the power supply section 35 and the speakers 36 and below the shield cover 31b, 32b and the power supply cover 33b. More specifically, the ventilation holes 102d formed in the lower-end portion of the back case flat portion 102c near the lower sidewall 102b2 are disposed between the inverter circuit sections 31 and the speakers 36.

There are no ventilation holes 102d formed in the portion of the back case flat portion which faces the inverter circuit board section 31, the signal circuit board section 32, and power supply circuit board section 33. Because of this structure, the present embodiment has a visually beneficial effect of the inner structure of the back case 102 being not seen.

Figure 6A:
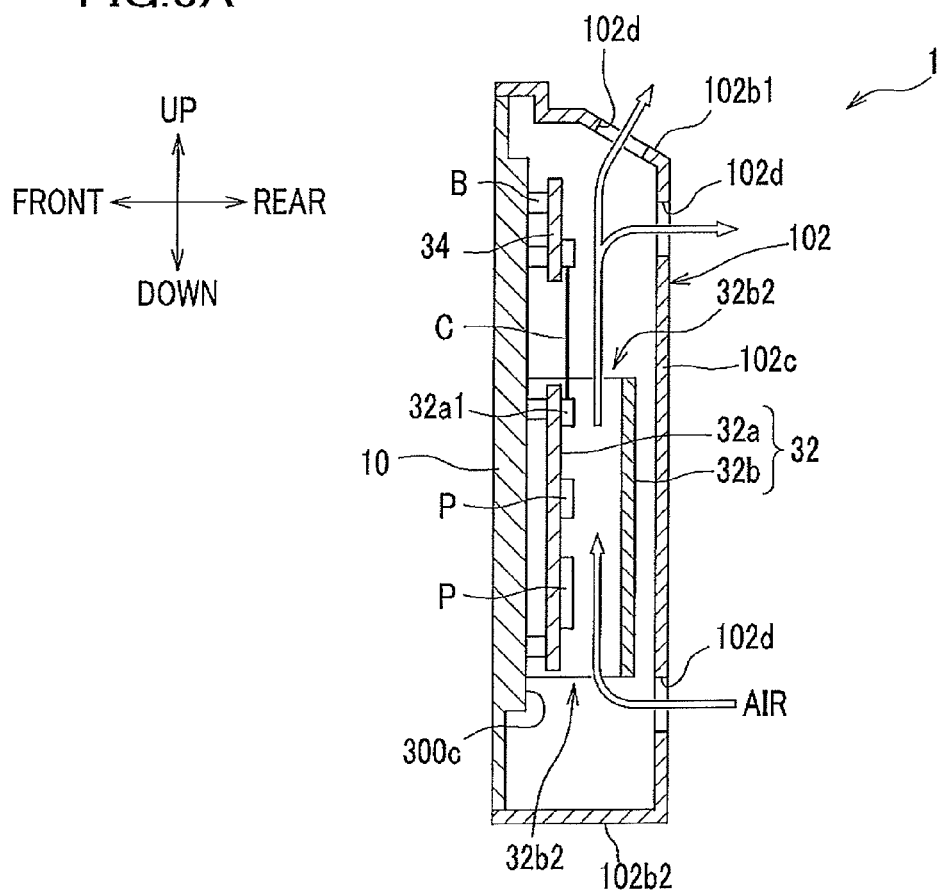
FIG. 6A is a sectional view of the housed liquid crystal display unit cut along the line X□X in FIG. 5B, in which air flow in the housing is schematically indicated.

FIG. 6A is a sectional view of the housed liquid crystal display unit cut along the line X☐X in FIG. 5B, in which air flow in the housing is schematically indicated. In FIG. 6A, the illustration of the liquid crystal monitoring unit 10 is simplified.

As shown in FIG. 6A, ventilation holes 102d are formed in the upper sidewall 102b1 of the back case 102. Ventilation holes 102d are formed both in the portion of the back case flat portion 102c above the shield cover 32b and in the portion of the back case flat portion 102c below the shield cover 32b as well.

Moreover, as seen in FIG. 4B, these two set of the ventilation holes 102d in the portion of the back case flat portion 102c above the shield cover 32b and below the shield cover 32b are disposed to face each other in the display vertical direction. Since ventilation holes 102d are formed in the back case 102 as above mentioned, the air heated by the heat generated by the signal circuit board 32a goes up as indicated by arrows in FIG. 6A and is discharged through the upper opening 32b2 of the shield cover 32b and further goes up and discharged to the outside through the ventilation holes 102d formed above the shield cover 32b.

Furthermore, along with the air being discharged from the upper side of the back case 102, fresh air is admitted inside the back case 102 through the ventilation opening 102d formed below the shield cover 32b. The air flows in through the lower ventilation opening 32b2 of the shield cover 32b, and goes up through between the shield cover 32b and the back frame 300c.

Since the shield cover 32b in the present embodiment has openings 32b2, 32b2 which face straight each other in the display vertical direction, as seen in FIG. 4A, the air between the shield cover 32b and the back frame 300c can goes up straight, forming an airflow path of efficient air convection. The direction of the airflow path corresponds to the direction in which the openings 32b2, 32b2 of the shield cover 32b face each other.

As just described, by forming the airflow path for efficient convection between the shield cover 32b and the back frame 300c, the heat generated by the signal circuit board 32a, which is disposed between the shield cover 32b and the back frame 300c, is efficiently exhausted.

Figure 6B:
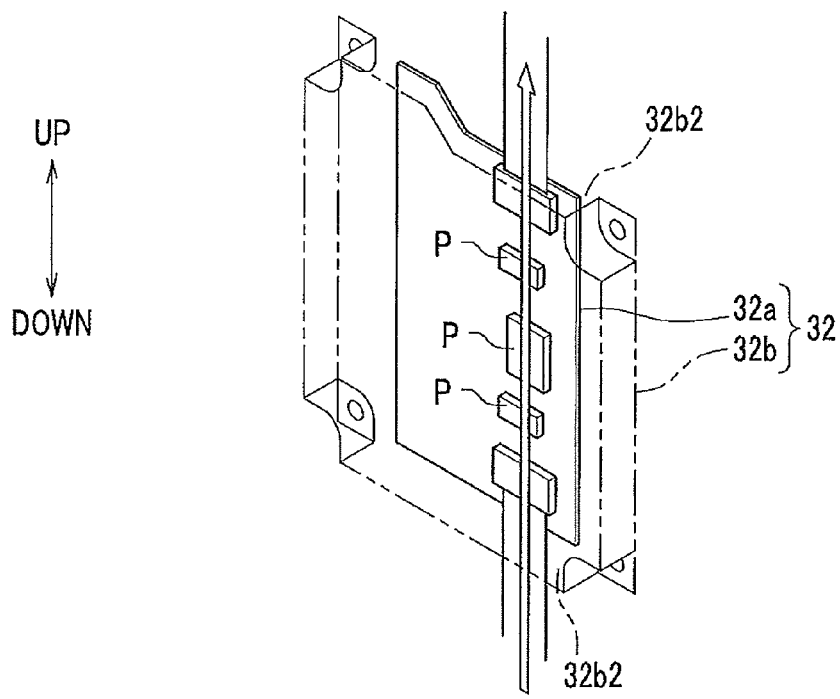
FIG. 6B is a perspective view of the signal circuit board section covered by the shield cover, which schematically indicates airflow over the signal circuit board inside the shield cover.

FIG. 6B is a perspective view of the signal circuit board section covered by the shield cover, which schematically indicates airflow over the signal circuit board inside the shield cover. As shown by the arrow in FIG. 6B, air flows up efficiently if the upper-opening 32b2 and lower-opening 32b2 both formed in the shield cover 32b face directly each other in the display vertical direction. In other words, the area between the openings 32b2 of the shield cover 32b, which face each other in the display vertical direction, is an area where the heat generated by the signal circuit board 32a can be efficiently exhausted.

Therefore, in the present embodiment as shown in FIG. 6B, a high heat generating components P to be mounted on the signal circuit board 32a, which generate more heat than other components, is disposed at a position on a signal circuit board across which the openings 32b2, 32b2 of the shield cover 32b over the signal circuit board 32a are disposed straight opposite each other in the display vertical direction. With this arrangement of the high heat generating components P, the heat generated by the high heat generating components P can be efficiently exhausted.

Additionally, if a plurality of the high heat generating components P, which generate more heat than others, are mounted on the signal circuit board 32a, these high heat generating components P may be disposed on a plurality of straight lines in parallel with the display vertical direction, along each of which the openings 32b2, 32b2 of the shield cover 32b are disposed opposite each other, so that only one of the plurality of the high heat generating components P is disposed on a straight line in the display vertical direction along which the openings 32b2, 32b2 of the shield cover 32b are disposed opposite each other. As a result of adopting this arrangement of the high heat generating components P, it is possible to prevent a high heat generating component P disposed at a lower position from having a heat influence on another component P disposed at a higher position. It goes without saying that this arrangement of the components P which generate more heat may be applied to the inverter circuit board 31a (as seen in FIG. 3) and the power supply circuit board 33a (as seen in FIG. 3).

If the shield cover 32b is formed in a substantially box shape with a sidewall formed in each of the upper side and the lower side cross sections, an equivalent effect is obtained by forming the upper opening 32b2 and the lower opening 32b2 which are disposed straight opposite each other in the display vertical direction.

Figure 7:
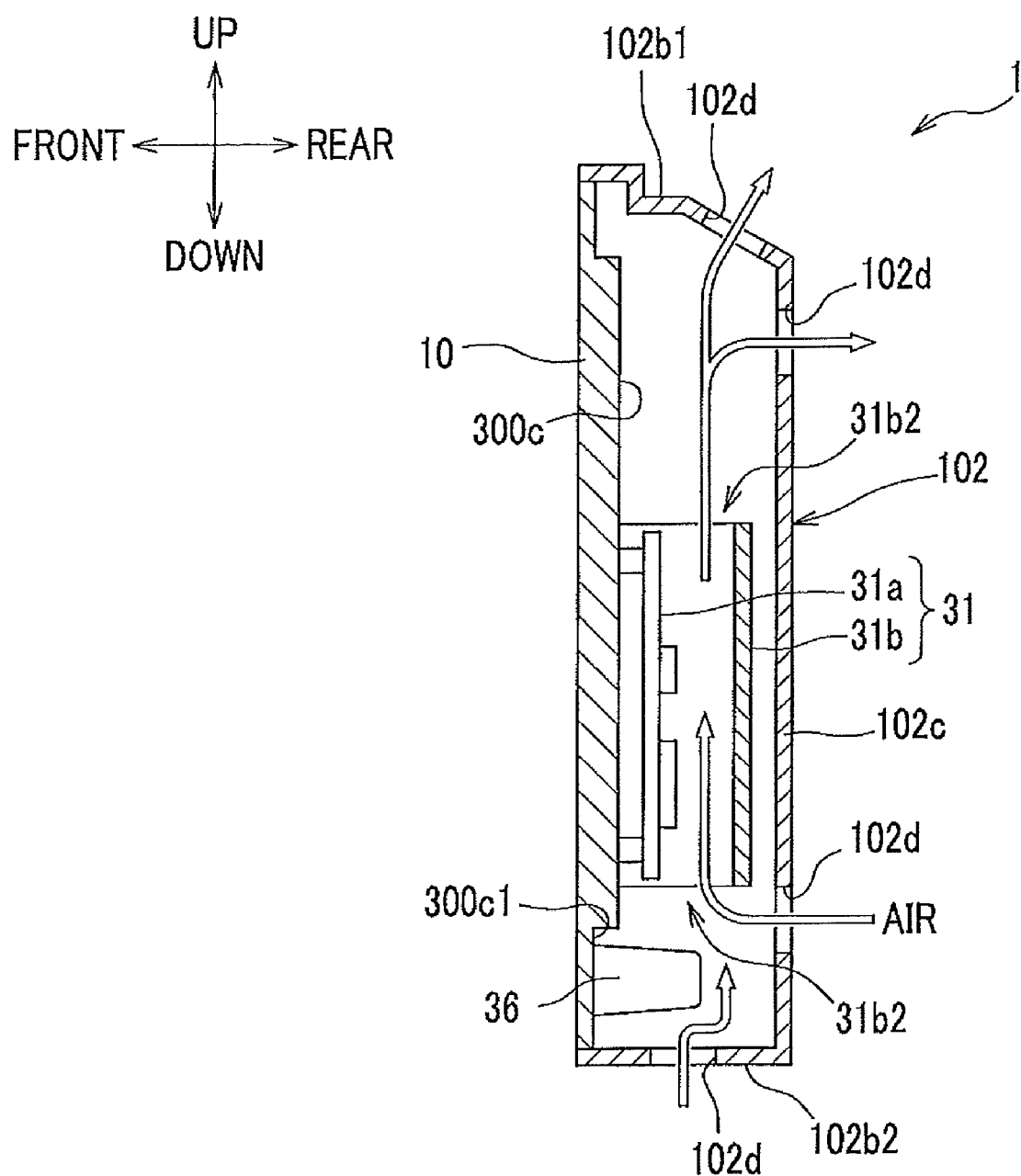
FIG. 7 is a sectional view of the housed liquid crystal display unit cut along the line Y□Y in FIG. 5B, in which airflow in the housing is schematically indicated.

FIG. 7 is a sectional view of the housed liquid crystal display unit cut along the line Y☐Y in FIG. 5B, in which airflow in the housing is schematically indicated. In FIG. 7, the illustration of the LCD monitor unit 10 and the speaker 36 are simplified.

As shown in FIG. 7, the speaker 36 is disposed on the lower flange 300c1 of the back frame 300c and the openings 102d are formed in the upper sidewall 102b1 and the lower sidewall 102b2 of the back case 102. Additionally, openings 102d are formed in the upper portion of the back case flat portion 102c of the back case 102, which is above the shield cover 31b, and other openings 102d are disposed in the lower portion of the back case flat portion 102c of the back case 102, which is below the shield cover 31b and above the speakers 36.

Additionally, as shown in FIG. 4A, openings 31b2 are formed at upper-portion and lower-portion of the shield cover 31b and disposed straight opposite each other in the display vertical direction. Due to this disposition of the openings 31b2, the air heated by the heat from the inverter circuit board 31a goes up as shown by the arrows in FIG. 7, is discharged through the upper opening 31b2 to outside the shield cover 31b, then further goes up and is discharged to outside the back case 102 through the openings 102d which are positioned above the shield cover 31b.

Furthermore, along with the air being discharged from the upper side of the back case 102, fresh air is admitted inside the back case 102 through the ventilation opening 102d formed below the shield cover 31b. The air flows in through the ventilation opening 31b2 below the shield cover 31b, and goes up through between the shield cover 31b and the back frame 300c.

Since the ventilation holes 102d which are disposed in the lower portion of the back cover 102 are positioned between the shield cover 31b and the speaker 36, the air is admitted inside the back case 102 without having the airflow disturbed by the speaker 36.

Since the shield cover 31b in the present embodiment has openings 31b2, 31b2 which face straight each other in the display vertical direction, as seen in FIG. 4A, the air between the shield cover 31b and the back frame 300c can goes up straight, forming an airflow path of efficient air convection.

As just described, by forming the airflow path for efficient convection between the shield cover 31b and the back frame 300c, the heat generated by the inverter circuit board 31a, which is disposed between the shield cover 31b and the back frame 300c, is efficiently exhausted.

Furthermore, the openings 102d are formed in the lower sidewall 102b2 of the back case 102. Fresh air is admitted inside the back case 102 and goes up from below the speaker 36 and the heat from the inverter circuit board 31a is exhausted by the convection airflow coming from below the speaker 36 as well.

As has been explained on the present embodiment, the board mount areas where the inverter circuit board section 31, the signal circuit board section 32, and the power supply circuit board section 33 are disposed are not limited to the arrangement indicated in FIG. 3. Each circuit board may be disposed in a different board mount area. Moreover, the number of the reinforcement member s12 and the number of the divided board mount areas from the circuit board mount surface 11 are not limited to what have been explained.

The liquid crystal display appliance according to an embodiment of the present invention disclosed hereinbefore has a structure in which the circuit board mount surface on the back side of the liquid crystal display monitor is divided into four separated board mount areas with three reinforcement members and each circuit board generating a relatively large amount of heat is disposed in a board mount area separated from the other circuit boards, and has a superior effect of preventing the heat generated by such a high heat generating circuit board as the power supply circuit board from affecting any of the other circuit boards.

Moreover each reinforcement member is attached to extend in the display vertical direction works as a separation wall to divide a space between the circuit board mount surface of the liquid crystal display monitor unit and the housing and air heated by heat generated by a circuit board goes up along the reinforcement member straight in the display vertical direction. Therefore the heat generated by the circuit board is efficiently exhausted.

Furthermore because each reinforcement member works as a separation wall to divide the space between the circuit board mount surface of the liquid crystal display monitor unit and the housing, the air heated by the heat generated by the power supply circuit board does not flow in an area where any of the other circuit boards is disposed. Accordingly the liquid crystal display appliance of this embodiment has an effect of preventing temperature rise in any of the other circuit boards due to the heat generated by the power circuit board. Obviously the liquid crystal display appliance of this embodiment may simultaneously take any other measure to prevent the temperature rise.

As for the shield cover to shield a circuit board adopted for the liquid crystal display appliance in the embodiment of the present invention, the openings on the shield cover through which cables to connect with the circuit board pass are disposed straight opposite each other and air going up along a airflow path inside the housing can go up efficiently between the shield cover and the back frame. Therefore the liquid crystal display appliance according to the embodiment of the present invention, which does not include any specific structure such as an opening to be formed, has an effect of exhausting efficiently heat generated by a circuit board disposed between the shield cover and the back frame. Obviously an additional measure to exhaust heat may be taken on the shield cover as well.

Furthermore as for the back case adopted for the liquid crystal display appliance in the embodiment of the present invention, ventilation holes for heat exhaustion are formed only in the upper and lower portions of the back case while there is no ventilation hole formed in the intermediate portion in the display vertical direction. With this arrangement of the ventilation holes, the strength of the back case is maintained and the inner structure of the back case can not be seen from outside, which results in a visually beneficial effect.

What is claimed is:

1. A liquid crystal display appliance comprising:
   a housing, and
   a liquid crystal display monitor unit comprising a liquid crystal display panel, a backlight unit illuminating the liquid crystal display panel from a back side of the liquid crystal display panel and circuit boards including a power supply circuit board, the circuit boards being disposed in a space between the housing and a back side surface of the liquid crystal display monitor unit which is disposed opposite the liquid crystal display panel across the back light unit,
   wherein the back side surface is divided into at least two board mount areas by at least one reinforcement member attached thereon and extending in a display vertical direction,
   wherein the power supply circuit board is mounted in one of the board mount area while the other circuit board is mounted in the other board mount area, and
   wherein the reinforcement member is a separation wall dividing the space so as to prevent an air heated by the power supply circuit board in the one board mount area from flowing into the other board mount area.

2. The liquid crystal display appliance according to claim 1,
   wherein each of the circuit boards is provided with a connector to which a cable is connected, and
   wherein the liquid crystal display monitor unit further comprises a shield cover shielding each of the circuit boards, the shield cover having at least an upper opening and a lower opening through which the cable passes, the upper opening formed on an upper end of the shield cover facing the lower opening formed on a lower end of the shield cover substantially straight in the display vertical direction.

3. The liquid crystal display appliance according to claim 2,
   wherein each of the circuit boards includes components and a high heat generating component which generates more heat than other components is disposed at a position across which the upper opening and the lower opening are disposed straight opposite each other in the display vertical direction.

4. The liquid crystal display appliance according to claim 3,
   wherein if there are a plurality of the high heat generating components to be mounted on any of the circuit boards, the high heat generating components are disposed on the any of the circuit boards so that only one of the high heat generating components on each straight line in the display vertical direction along which the upper opening and the lower opening are disposed opposite each other.

5. The liquid crystal display appliance according to claim 1,
   wherein the circuit boards include:
   a signal circuit board for generating an image signal with which a picture image is displayed by the liquid crystal display unit and a TCON circuit board for generating a driving signal synchronized with the image signal with which the liquid crystal display panel is driven, the TCON circuit board disposed in the board mount area where the signal circuit board is disposed.

6. The liquid crystal display appliance according to claim 5,
   wherein the circuit boards further include an inverter circuit board for driving a the backlight unit which is disposed in a board mount area different from the board mount area where the signal circuit board and the TCON circuit board are disposed.

7. The liquid crystal display appliance according to claim 1,
   wherein the housing includes a back case which is substantially in a box-shape and comprise a back case flat portion and a sidewall surrounding the back case flat portion, the sidewall including an upper sidewall disposed over the back case flat portion and a lower sidewall disposed under the back case flat portion,
   wherein ventilation holes are formed in the upper sidewall, in the lower sidewall, in an upper end portion of the back case flat portion in a vicinity of the upper sidewall and in a lower end portion of the back case flat portion in a vicinity of the lower sidewall, and
   wherein an airflow path inside the housing through which air flows in the display vertical direction.

8. The liquid crystal display appliance according to claim 7,
   wherein the liquid crystal display monitor unit further comprises a shield cover shielding each of the circuit boards, the shield cover having at least an upper opening and a lower opening through which the cable passes, the upper opening formed on an upper end of the shield cover facing the lower opening formed on a lower end of the shield cover substantially straight in the display vertical direction, and
   wherein the ventilation holes formed in the lower end portion of the back case flat portion in the vicinity of the lower sidewall are disposed below the lower opening formed on the shield cover in the liquid crystal display monitor unit when the liquid crystal display monitor unit is accommodated in the back case.

9. The liquid crystal display appliance according to claim 7,
   wherein the liquid crystal display monitor unit further comprises a shield cover shielding each of the circuit boards, the shield cover having at least an upper opening and a lower opening through which the cable passes, the upper opening formed on an upper end of the shield cover facing the lower opening formed on a lower end of the shield cover substantially straight in the display vertical direction, and wherein an air flow path direction in which the air flow in the airflow path is substantially equal to a shield cover opening direction in which the upper opening and the lower opening on the shield cover face each other.

10. The liquid crystal display appliance according to claim 7,
wherein there is no ventilation hole formed at a portion of the back case which faces any of the circuit boards inclusive of the power supply circuit board.

11. The liquid crystal display appliance according to claim 7,
wherein the liquid crystal display monitor unit further comprises a speaker installed below the inverter circuit board, and
wherein the ventilation holes formed in the lower end portion of the back case flat portion in the vicinity of the lower sidewall are disposed between the inverter circuit board and the speaker when the liquid crystal display monitor unit is accommodated in the back case.

* * * * *